United States Patent
Taniguchi et al.

(10) Patent No.: US 7,811,909 B2
(45) Date of Patent: Oct. 12, 2010

(54) PRODUCTION OF A HEXAGONAL BORON NITRIDE CRYSTAL BODY CAPABLE OF EMITTING OUT ULTRAVIOLET RADIATION

(75) Inventors: Takashi Taniguchi, Tsukuba (JP); Kenji Watanabe, Tsubuka (JP); Yoichi Kubota, Tsukuba (JP); Osamu Tsuda, Tsukuba (JP)

(73) Assignee: National Institute for Materials Science, Tsukuba-Shi, Ibaraki (JP)

( * ) Notice: Subject to any disclaimer, the term of this patent is extended or adjusted under 35 U.S.C. 154(b) by 0 days.

(21) Appl. No.: 12/451,641

(22) PCT Filed: May 22, 2008

(86) PCT No.: PCT/JP2008/059851
§ 371 (c)(1),
(2), (4) Date: Jan. 15, 2010

(87) PCT Pub. No.: WO2008/146865
PCT Pub. Date: Dec. 4, 2008

(65) Prior Publication Data
US 2010/0120187 A1    May 13, 2010

(30) Foreign Application Priority Data
May 24, 2007    (JP) .............................. 2007-137365

(51) Int. Cl.
H01L 21/00    (2006.01)
H01L 21/208   (2006.01)

(52) U.S. Cl. ............... 438/486; 438/29; 438/46; 438/500; 257/E21.133

(58) Field of Classification Search ................... 438/29, 438/46, 486, 500
See application file for complete search history.

(56) References Cited

U.S. PATENT DOCUMENTS

| 2005/0158909 A1* | 7/2005 | Milliron et al. | 438/85 |
| 2009/0093122 A1* | 4/2009 | Ueda et al. | 438/701 |
| 2009/0191659 A1* | 7/2009 | Song | 438/46 |
| 2010/0155754 A1* | 6/2010 | Kasahara et al. | 257/98 |

* cited by examiner

*Primary Examiner*—Alexander G Ghyka
(74) *Attorney, Agent, or Firm*—Manabu Kanesaka

(57) ABSTRACT

The invention has for its object to provide a process of synthesizing high-purity hBN crystal bodies on a robust substrate even under normal pressure.

The inventive process of producing hexagonal boron nitride crystal bodies is characterized by comprising a preparation step of preparing a mixture of a boron nitride raw material and a metal solvent comprising a transition metal, a contact step of bringing a sapphire substrate in contact with the mixture, a heating step of heating the mixture, and a recrystallization step of recrystallizing at normal pressure a melt obtained in the heating step. It is also characterized by using as the metal solvent a transition metal selected from the group consisting of Fe, Ni, Co, and a combination thereof, and at least one substance selected from the group consisting of Cr, TiN and V without recourse to any sapphire substrate.

12 Claims, 8 Drawing Sheets

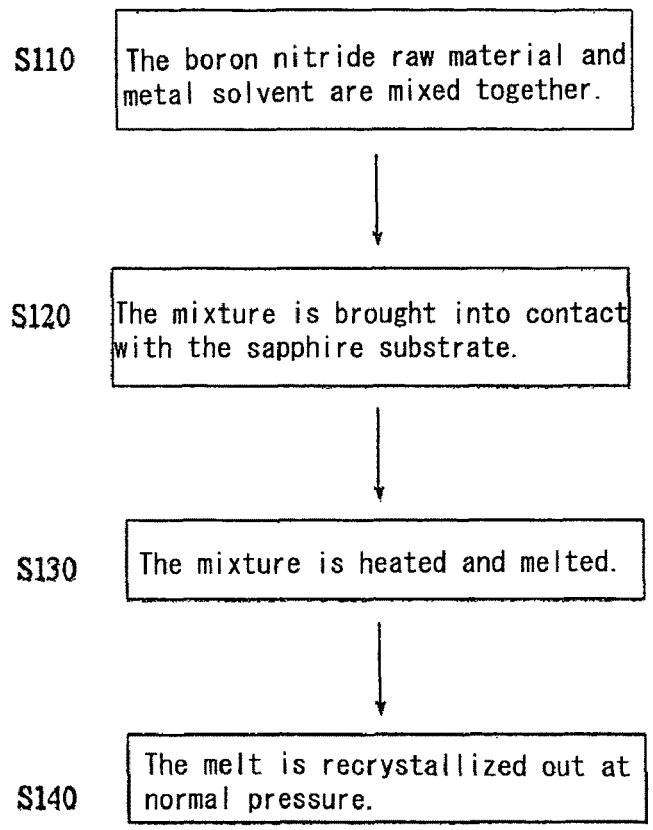
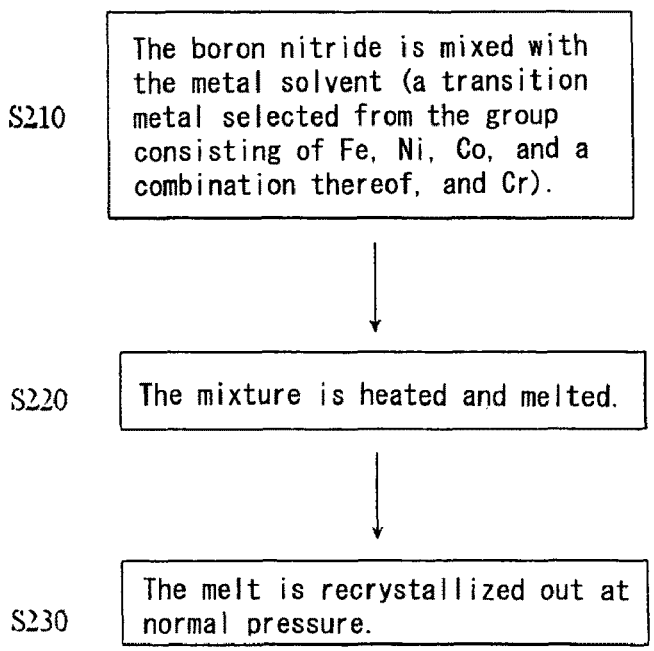

US 7,811,909 B2

PRODUCTION OF A HEXAGONAL BORON NITRIDE CRYSTAL BODY CAPABLE OF EMITTING OUT ULTRAVIOLET RADIATION

ART FIELD

The present invention relates generally to a process of producing hexagonal boron nitride crystal bodies, and more specifically to a process of producing a hexagonal boron nitride crystal body capable of emitting out ultraviolet radiation in a wavelength range of 210 to 230 nm.

BACKGROUND ART

Development and research of solid-state light emitting devices in an ultraviolet range having wavelengths of lower than 380 nm would be expected to find use not only for information recording fields inclusive of DVDs but also for creation of a lot of new industries in preservation-of-the-environment fields such as sterilization as well as medical fields.

Light emitting devices for short wavelengths in the ultraviolet range are usually fabricated by making the most of wide-band gap semiconductors, but so far development and research of mixed crystals based on aluminum nitride and gallium nitride are in progress. However, aluminum nitride has a band gap of 6.0 eV to enable fabrication of light emitting devices on the wavelength order of 200 nm, yet it makes fabrication of good-quality, high-purity crystals not easy and a new approach to development of light emitting devices is still in demand.

On the other hand, wide-band gap semiconductor candidates other than aluminum nitride for solid-state light emitting devices on the emitting wavelength order of 200 nm include diamonds, cubic boron nitrides (hereinafter referred to as cBN) and hexagonal boron nitrides (hereinafter referred to as hBN) that are now under development and research for possible applications.

For hBN among others, it has now been found by the inventors that it possesses a direct transition type of semiconductor characteristics having a band gap of 5.97 eV and has high potentials for application as high-efficiency light emitting materials in the deep ultraviolet range to light emitting devices such as semiconductor lasers (for instance, see Patent Publication 1 and Non-Patent Publication 1).

The material hBN, because of being chemically stable by reason of good corrosion resistance and high melting points, is successfully used as electrically and thermally insulating material, but so far there have been no or little studies made while paying attention to the optical physical properties of hBN. This is primarily because it is difficult to obtain hBN in the form of a good single crystal: there has been no successful preparation of high-purity single crystals in the art.

That is, recent attention to the property of hBN well fit for deep ultraviolet emitting material lies in Patent Publication 1 revealing the synthesis of high-purity single crystals, and much about the optical properties of hBN.

High-purity hBN single crystals are obtained by recrystallization of the raw material boron nitride using as a solvent the nitride of a high-purity alkali metal and an alkaline-earth metal (such as barium, and lithium) as well as their boronitride, with high-brightness ultraviolet emissions at or near 215 nm. For this process the atmosphere used under the synthesis conditions and the high purity of the solvent used are important. Still, the boronitrides of the alkali metal and alkaline-earth metal used as the solvent are hard to work with because of reacting readily with water and oxygen, and require for the synthesis to be carried out in a sealed vessel under high temperature and pressure in order to prevent decomposition and oxidization of the solvent.

On the other hand, a growing solvent for bulk crystal synthesis by a solvent process takes a role of dissolving the raw material that is a solute in the solvent at high temperature, helping crystallization of the raw material upon recrystallization in a low-temperature region, and a choice of proper solvent is an imperative challenge for allowing the precipitating crystal to have higher purity or be devoid of defects, and letting the synthesis process have higher efficiency.

In view of such a challenge, the inventors have now discovered that high-purity hBN single crystals are obtainable by use of transition metal-base solvents such as nickel, more exactly a Ni—Mo alloy, without recourse to the aforesaid high-purity alkali metal (for instance, see Patent Publication 2 and Non-Patent Publication 2). With the transition metal-base solvents that are stable even under less than 1 atm, it is possible to synthesize high-purity hBN, for which a high-pressure process has been needed so far, by recrystallization from the solvent under 1 atm.

However, the above method makes it possible to obtain hBN crystals only in a very hard-to-work-with thin film form. The material hBN is in a layer compound form, and so stacking faults by mechanical deformation.

The crystal growth solvent selected must have good enough solubility with respect to the solute, and there would otherwise be no good-quality crystal obtained. In this regard, a problem with a Ni solvent is that its solubility with respect to boron that forms BN is relatively high, but its solubility with respect to nitrogen remains low. The fact that the Ni—Mo base solvent provides a good quality crystal could be due to the addition of Mo to Ni resulting in an improved solubility with respect to nitrogen (for instance, see Non-Patent Publication 3).

If there is a solvent that makes nitrogen solubility much higher than the Ni—Mo base solvent, it would work more for recrystallization of hBN.

Patent Publication 1: JP(A) 2005-145788

Patent Publication 2: JP(A) 2008-007388

Non-Patent Publication 1:

K. Watanabe, T. Taniguchi and H. Kanda, Nature Materials, 3, 404 (2004)

Non-Patent Publication 2:

Y. Kubota, T. Taniguchi, K. Watanabe, Jpn. J. Appl. Phys. 46, 311 (2007)

Non-Patent Publication 3:

C. Kowanda, M. O. Speidel, Scripta Materiallia. 48, 1073 (2003)

DISCLOSURE OF THE INVENTION

Problem to be Solved by the Invention

Thus, in order to ensure stable supply of high-purity hBN single crystals showing good deep ultraviolet emission characteristics and developing applications and studies of them for practical use, it is important to set up a method of synthesizing high-purity hBN single crystals under normal pressure and control them into an easy-to-handle form.

More specifically, in view of such problems with the prior art as mentioned above, the first object of the invention is to improve on conventional hBN synthesis methods, thereby providing a process of synthesizing a high-purity hBN crystal body on a robust substrate even under normal pressure yet in a simpler manner than ever before.

The second object of the invention is to provide a synthesis method for an hBN crystal body that has an easy-to-handle thickness: the reason is that if a crystal film of sufficient thickness is obtained albeit having a stacking structure, it becomes easy to handle.

Means for Solving the Problems

According to the first aspect of the invention, there is a process of producing a hexagonal boron nitride crystal body provided, which is characterized by comprising:

a preparation step of preparing a mixture of a boron nitride raw material and a metal solvent comprising a transition metal, a contact step of bringing a sapphire substrate in contact with said mixture, a heating step of heating said mixture, and a recrystallization step of recrystallizing at normal pressure a melt obtained in said heating step.

According to the second aspect of the invention, the process of the first aspect is further characterized in that said hexagonal boron nitride crystal body emits out ultraviolet radiation in a wavelength range of 210 to 230 nm.

According to the third aspect of the invention, the process of the first aspect is further characterized in that said metal solvent is selected from the group of consisting of Fe, Ni, Co, and a combination thereof.

According to the fourth aspect of the invention, there is a process of producing a hexagonal boron nitride crystal body provided which is characterized by comprising:

a preparation step of preparing a mixture of a boron nitride raw material and a metal solvent comprising a transition metal, wherein said metal solvent includes a transition metal selected from the group consisting of Fe, Ni, Co, and a combination thereof, and at least one substance selected from the group consisting of Cr, TiN and V, a heating step of heating said mixture, and a recrystallization step of recrystallizing at normal pressure a melt obtained in said heating step.

According to the fifth aspect of the invention, the process of the fourth aspect is further characterized in that said hexagonal boron nitride crystal body emits out ultraviolet radiation in a wavelength range of 210 to 230 nm.

According to the sixth aspect of the invention, the process of the third or fourth aspect is further characterized in that said metal solvent further includes Mo.

According to the seventh aspect of the invention, the process of the first or fourth aspect is further characterized in that said boron nitride raw material is hexagonal boron nitride.

According to the eighth aspect of the invention, the process of the first or fourth aspect is further characterized in that before said preparation step, there is a step provided of deoxidizing said boron nitride raw material.

According to the ninth aspect of the invention, the process of the first or fourth aspect is further characterized in that in said heating step said mixture is heated up to a temperature higher than an eutectic point of said boron nitride raw material and said metal solvent.

According to the tenth aspect of the invention, the process of the first or fourth aspect is further characterized in that said heating step, and said recrystallization step is implemented in an inert atmosphere.

According to the 11$^{th}$ aspect of the invention, the process of the first or fourth aspect is further characterized in that in said recrystallization step said melt is either cooled down or provided with a temperature gradient.

According to the 12$^{th}$ aspect of the invention, the process of the first or fourth aspect is further characterized in that after said recrystallization step, there is a step provided of removing said metal solvent using a solution containing hydrochloric acid and nitric acid.

Advantages of the Invention

With the process of the first aspect of the invention, it is possible to supply onto a sapphire substrate a hexagonal boron nitride crystal body showing a high-brightness emission behavior near 215 nm wavelength under normal pressure yet in a simple manner without recourse to expensive and special equipment. This makes the obtained crystal body easier to handle.

With the process of the fourth aspect of the invention, it is possible to use as the solvent at least one substance selected from the group consisting of Cr, TiN and V, thereby providing a thick, self-supported hexagonal boron nitride crystal body, which shows a high-brightness emission behavior near 215 nm wavelength, under normal pressure yet in a simple manner without recourse to expensive and special equipment. This makes the obtained crystal body easier to handle.

BRIEF DESCRIPTION OF THE DRAWING

FIG. 1 is a flowchart illustrative of a process of producing a high-purity hBN single crystal according to Embodiment 1 of the invention.

FIG. 2 is a flowchart illustrative of a process of producing a high-purity hBN single crystal according to Embodiment 2 of the invention.

BEST MODE FOR CARRYING OUT THE INVENTION

Figure 3:
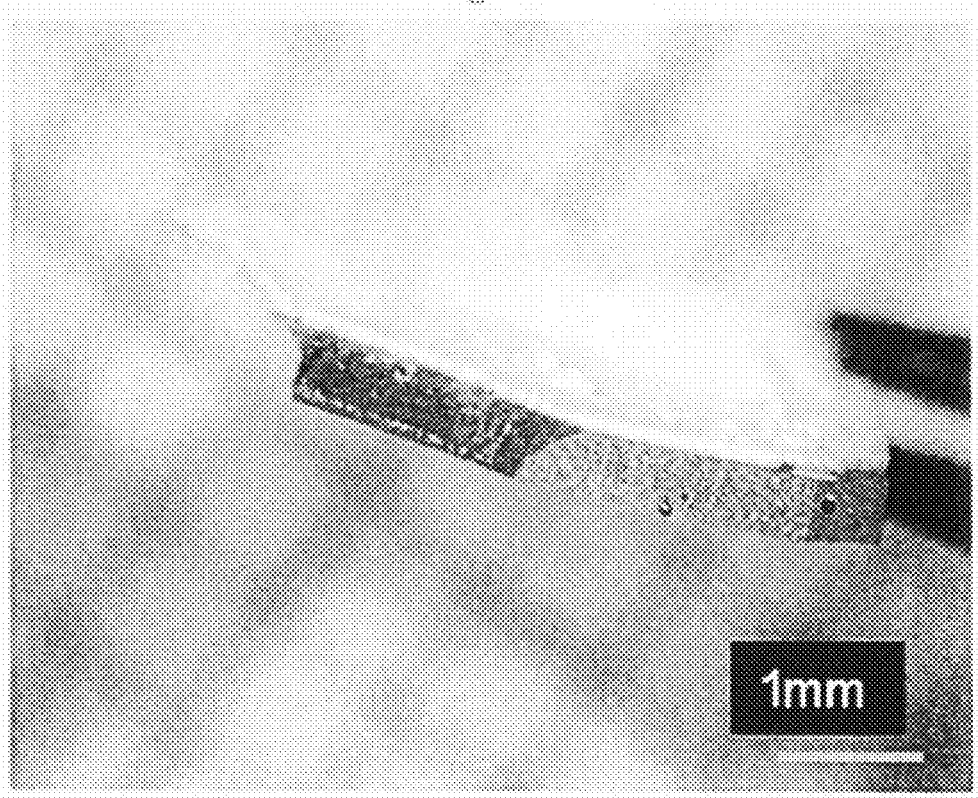
FIG. 3 is illustrative of the results of optical microscopy in Example 1.

Embodiments of the invention are now explained with reference to the accompanying drawings wherein like elements are indicated by like reference numerals, and so will be not explained.

Embodiment 1

FIG. 1 is a flowchart illustrative of a process of producing a high-purity hBN single crystal according to Embodiment 1 of the invention.

The present invention is concerned with high-purity hBN single crystals capable of emitting out ultraviolet light in a short wavelength range and a synthesis process of the same. The invention uses as the solvent a transition metal or its alloy, and allows hBN to be recrystallized out of a melt solution thereby obtaining high-purity hBN single crystals capable of emitting out ultraviolet light. The inventive process is now expounded step by step with reference to FIG. 1.

Step S110:

A mixture of the boron nitride raw material and the metal solvent comprising a transition metal is prepared. For the boron nitride raw material, any desired material capable of supplying boron nitride to the metal solvent may be used in any desired form and shape, for instance, a powdery or sintered form. It goes without saying that the higher the purity of the boron nitride raw material, the higher the purity of the ensuing hBN crystal body becomes, yet it is preferable that the purity of the boron nitride raw material is greater than 99.9%. If a boron nitride raw material having more than 99.9% purities is used, it then ensures that the produced hBN crystal body is used as an emitting material. It is also preferable to use as the boron nitride raw material hBN that belongs to the same crystal system as the produced hBN crystal body, because recrystallization then occurs readily.

It is preferable that the boron nitride raw material is deoxidized beforehand, because there is a further reduction achievable in oxygen or other impurities. Deoxidization may be implemented by heating in a vacuum or an inert atmosphere. By way of example but not by way of limitation, deoxidization is carried out first in a vacuum and in a temperature range of $13 \times 10^{2\circ}$ C. to $15 \times 10^{2\circ}$ C. inclusive for at least 1 hour, and then in an inert atmosphere and in a temperature range of $15 \times 10^{2\circ}$ C. to $25 \times 10^{2\circ}$ C. inclusive for at least 1 hour.

The solvent used here is a transition metal selected from the group consisting of Fe, Ni, Co, and a combination thereof. Preferably, the solvent should further contain Mo. To obtain good-quality crystals, it is necessary to make sure of the sufficient solubility in the solvent of solutes (boron and nitrogen that form boron nitride here). For instance, a single Ni solvent may be used as the solvent, because the solubility of boron therein is high. More preferably, a Ni—Mo base solvent is used as the solvent, because, as compared with the use of the single Ni solvent, the solubility of nitrogen is much more improved while the solubility of boron is kept high.

Note here that the metal solvent, because of turning eventually into a melt, may be used in any desired form, for instance, in a powdery, flaky or block form. While the boron nitride raw material and the metal solvent comprising a transition metal here are described as being separate components, it should be understood that the metal solvent containing beforehand boron nitride in an amount less than the saturation concentration predicted at the synthesis temperature may be used.

Also note that the amounts in the mixture of the boron nitride raw material and the metal solvent comprising a transition metal may be determined depending on crystal synthesis conditions, if the raw material is supplied to the metal solvent such that supersaturation is always kept during crystal growth.

What is intended by the "mixture" here is not only a state where the boron nitride raw material is in complete admixture with the solvent but also a state where the boron nitride raw material and the solvent are simply stacked together. There is no limitation on how to fill or charge the mixture in the vessel such as mixing of the raw material and solvent or stacking of the mixture.

Step S120:

The sapphire substrate is brought in contact with the mixture prepared in Step S110. Specifically, the mixture is filled up in a vessel, and the sapphire substrate is located over the mixture. Although the vessel chosen here may not react with the melted solvent, it is preferable to use a boron nitride vessel because incorporation of impurities from the vessel is prevented while, at the same time, the raw material is supplied.

Charging of the mixture in the vessel may be carried out at any desired pressure in any desired atmosphere; however, it should preferably occur at normal pressure in the atmosphere if incorporation of impurities is avoidable. The sapphire substrate may be located in any desired manner if it is in contact with the solvent in a melt state.

Step S130:

The mixture is heated. The temperature conditions here may be determined depending on the type of the solvent used, because the temperature may in principle be higher than the eutectic point of boron nitride and the metal solvent. This then causes the solvent to be melted with the boron nitride raw material dissolving in the solvent. There is no particular limitation on the heating time; however, heating and holding the mixture at a temperature higher than that eutectic point for at least 4 hours makes sure it is melted. While there is no upper limit provided on the heating temperature, it is preferable that the heating time is 4 hours to 24 hours inclusive, in view of production cost and production time. Heating is preferably implemented in an inert atmosphere in order to minimize incorporation of oxygen or other impurities. Note here that the "inert atmosphere" referred to in the present disclosure may possibly be a rare gas such as Ar, and $N_2$ gas with controlled oxygen partial pressure, but preference is given to the $N_2$ gas for the purpose of preventing elimination of nitrogen.

Step S140:

The melt obtained in Step S130 is recrystallized at normal pressure. Through ingenuity, the inventors have found that hBN single crystals are produced under normal pressure even on the sapphire substrate located in Step S130.

In the present invention, recrystallization at normal pressure (or atmospheric pressure) is implemented without recourse to any exclusive equipment such as a high-pressure vessel, and a high pressure generator. This gets rid of dependency on the size of the exclusive equipment, yielding hBN crystal bodies larger in area/size than ever before. There is none of exclusive equipment such as a high pressure generator needed, resulting in the slashing of production cost. As a matter of course, synthesis under high pressure is feasible too.

Recrystallization is a process in which the temperature of the solvent with boron nitride dissolving in a super-saturation state is reduced down, thereby inducing recrystallization of boron nitride supersaturated in the solvent. As temperature grows high, the solubility in the solvent of boron nitride that is a solute component grows high, and as the solvent cools down, that solubility goes low. Thus, boron nitride that is the solute component dissolved at high temperature will be recrystallized by cooling. The recrystallization here is implemented by cooling the melt or providing the melt with a temperature gradient.

More specifically, cooling of the melt is implemented by cooling the solvent, in which boron nitride is dissolved at high temperature using a heating unit such as a heater, down to room temperature at a given speed. The temperature gradient may be provided to the melt by supersaturating boron nitride positioned at a low-temperature site. Those skilled in the art could optionally adjust the respective specific methods.

Like Step S130, Step S140, too, is preferably carried out in an inert atmosphere in order to minimize incorporation of oxygen or other impurities. Note here that Step S140 may be followed by an additional step of removing excessive metal solvent. For removal of the metal solvent a mixed solution of hydrochloric acid and nitric acid is used, whereby the hBN crystal body alone may be collected.

As described above, Embodiment 1 of the invention is achievable by a process wherein boron nitride is dissolved in the transition metal and its alloy as the solvent, the sapphire substrate is located in place upon recrystallization out of the supersaturated solvent, and crystals are grown on it, thereby obtaining a high-purity hBN crystal body. That is, a high-purity hBN crystal body capable of emitting out high-brightness ultraviolet radiation near 215 nm wavelength can be provided under normal pressure yet in a simple manner not achieved so far in the art. The thus obtained hBN crystal body is suitable as an ultraviolet emitting device. Note that "near 215 nm wavelength" in Embodiment 1 here is understood to refer to the range of 210 nm to 230 nm.

Embodiment 2

FIG. 2 is a flowchart illustrative of a process of producing a high-purity hBN single crystal body according to Embodiment 2 of the invention.

Step S210:

A mixture containing the boron nitride raw material and the metal solvent comprising a transition metal is prepared. The solvent contains a transition metal selected from the group consisting of Fe, Ni, Co, and a combination thereof, and at least one substance selected from the group consisting of Cr, TiN and V. Unlike Embodiment 1, this embodiment would be expected to introduce further improvements in the solubility of nitrogen by letting the solvent contain at least one substance selected from the group consisting of Cr, TiN and V. For instance, it has been found that when a Ni—Cr (or TiN or V) base solvent is used as the solvent, crystal growth rate can be much more improved as compared with the use of the Ni—Mo base solvent. More preferably, the above solvent should contain Mo in addition to the above transition metal and at least one substance selected from the group consisting of Cr, TiN and V. This in turn makes the solubility of boron and nitrogen much higher, making it easy to obtain good-quality crystals. Even through the simultaneous addition of Cr and TiN, the simultaneous addition of Cr and V or other combinations, too, the above advantages would be expected. The shapes, etc. of the boron nitride raw material and the solvent will not be explained anymore because of being similar to those in Step S110 explained with reference to FIG. 1.

Step S220:

The mixture is heated.

Step S230:

The metal obtained in Step S220 is recrystallized at normal pressure. Steps S220 and S230 will not be explained anymore because of being similar to Steps S130 and S140 explained in detail with reference to FIG. 1.

The inventors have found that by using for the solvent at least one substance selected from the group consisting of Cr, TiN and V, it is possible to produce self-supported, high-quality hBN of large thickness (for instance, more than 40 μm).

As described above, Embodiment 2 of the invention is a process wherein boron nitride is dissolved using as the solvent comprising a transition metal at least one substance selected from the group consisting of Cr, TiN and V for recrystallization out of the supersaturated solvent, thereby obtaining a thick, self-supported, high-purity hBN crystal body. That is, a high-purity hBN crystal body capable of emitting out high-brightness ultraviolet radiation near 215 nm wavelength can be provided under normal pressure yet in a simple manner not achieved so far in the art. The thus obtained hBN crystal body is suitable as an ultraviolet radiation emitter device. Unlike Embodiment 1, there is no need of using the sapphire substrate: the cost of the sapphire substrate can be slashed down. Note that "near 215 nm wavelength" in Embodiment 2 here, too, is understood refer to the range of 210 nm to 230 nm.

The invention is now explained with reference to some examples and the accompanying drawings. It should here be noted that the examples, etc. are just only provided as an aid to have an easy understanding of the invention, and the invention is by no sense limited to them. For simplification, the synthesis conditions in the examples and a comparative example are set out in Table 1.

TABLE 1

Synthesis Conditions in Examples 1-9 and Comparative Example 1

| | Raw Material | Metal Solvent | Raw Material: Metal Solvent Ratio by Weight | Sapphire Substrate | Heating Conditions | Recyrstallization Conditions |
| --- | --- | --- | --- | --- | --- | --- |
| Example 1 | hBN | Ni, Co, Fe | 1:10 | Applied | 1,400° C., 6 h | 1,400° C. → 1,270° C. (@2° C./h) → room temp. |
| Example 2 | hBN | Ni, Mo | 1:10 | Applied | 1,400° C., 12 h | 1,400° C. → 1,100° C. (@4° C./h) → room temp. |
| Example 3 | hBN | Ni, Cr | 1:10 | — | 1,430° C., | 1,430° C. → 1,250° C. |

TABLE 1-continued

Synthesis Conditions in Examples 1-9 and Comparative Example 1

| | Raw Material | Metal Solvent | Raw Material: Metal Solvent Ratio by Weight | Sapphire Substrate | Heating Conditions | Recyrstallization Conditions |
|---|---|---|---|---|---|---|
| Example 4 | hBN | Ni, Mo, Cr | 1:20 | — | 1,430° C., 9 h | 1,430° C. → 1,280° C. (@4° C./h) → room temp. |
| Example 5 | hBN | Ni, Co, Mo, Cr | 1:20 | — | 1,450° C., 4 h | 1,450° C. → 1,280° C. (@4° C./h) → room temp. |
| Example 6 | hBN | Ni, Co, Fe, Cr | 1:20 | — | 1,400° C., 4 h | 1,400° C. → 1,280° C. (@5° C./h) → room temp. |
| Example 7 | hBN | Ni, Mo, TiN | 1:20 | — | 1,530° C., 12 h | 1,530° C. → 1,250° C. (@4° C./h) → room temp. |
| Example 8 | hBN | Ni, V | 1:10 | — | 1,400° C., 6 h | 1,400° C. → 1,240° C. (@4° C./h) → room temp. |
| Example 9 | hBN | Ni, Co, Mo, V | 1:10 | — | 1,400° C., 6 h | 1,400° C. → 1,240° C. (@4° C./h) → room temp. |
| Comp. Ex. 1 | hBN | Ni, Cr | 1:10 | Applied | 1,430° C., 9 h | 1,430° C. → 1,250° C. (@4° C./h) → room temp. |

Example 1

The raw material used was hexagonal boron nitride (having a grain size of about 0.5 μm) that had been thermally deoxidized at 1,500° C. in a vacuum and at 2,000° C. in a nitrogen gas stream. The metal solvent used was a particulate Ni—Co—Fe alloy having a composition ratio of 31:5:64 by weight. The raw material and solvent were charged up in a vessel made of sintered hBN at a weight ratio of 1:10 (Step S110 in FIG. 1). Then, a sapphire substrate was located on the solvent (Step S120 in FIG. 1). Solvent preparation and sample charging were all implemented in the atmosphere.

Using a resistance heating furnace to melt the metal solvent, after which the melt was slowly cooled for synthesis of a crystal body. Synthesis conditions involved heating the raw material and solvent up to 1,400° C. at a heating rate of 25×10° C./hour, holding the melt for 6 hours (Step S130 in FIG. 1), cooling the melt down to 1,270° C. at 2° C./hour, and letting the melt cool down to room temperature (Step S140 in FIG. 1).

Chemical treatment (hydrochloric acid/nitric, acid mixture) was applied for metal solvent removal thereby collecting samples. The crystal body on the sapphire substrate was observed under an optical microscope (FIG. 2), and estimated for its optical characteristics through cathode luminescence observation (FIG. 3).

FIG. 3 is indicative of the results of optical microscopy in Example 1.

As can clearly be seen from FIG. 3, white crystals were obtained on the sapphire substrate.

Figure 4:
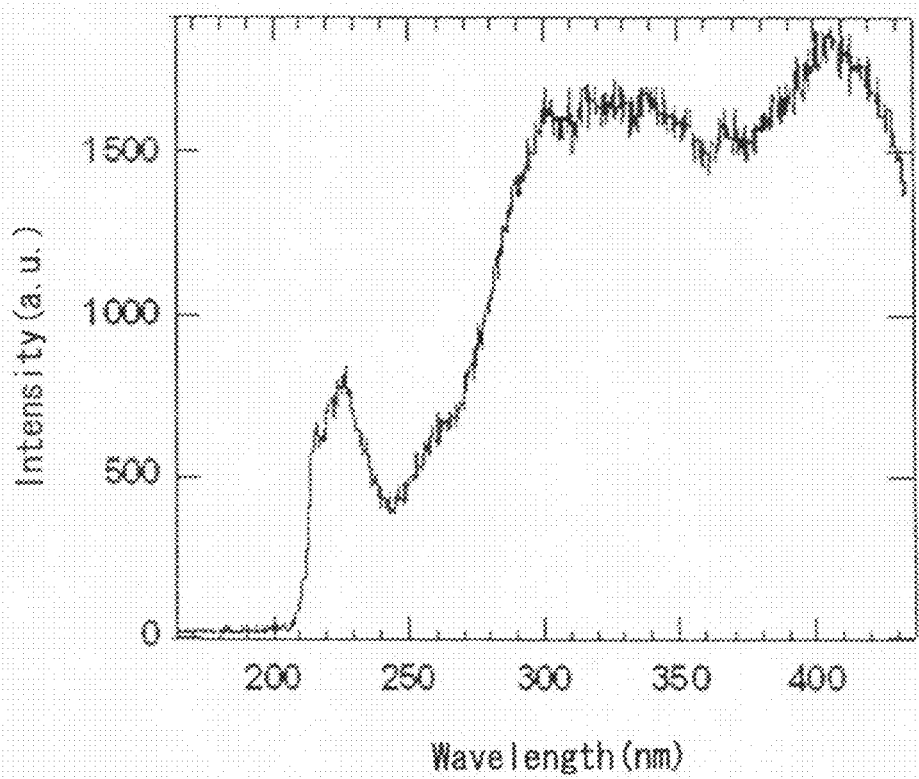
FIG. 4 is indicative of cathode luminescence spectra in Example 1.

FIG. 4 is indicative of cathode luminescence spectra in Example 1.

As shown in FIG. 4, cathode luminescence observation indicates that there are ultraviolet emissions in a wavelength range of 210 to 230 nm and a wavelength range of 300 to 400 nm at room temperature. From this, it is also appreciated that hBN crystals can grow onto the sapphire substrate by the Ni—Co—Fe alloy solvent, and there are hBN band edge emissions near 215 nm wavelength. At the same time, however, there were 300 to 400 nm emissions observed which would originate from defects in hBN.

Example 2

The raw material used was hexagonal boron nitride (having a grain size of about 0.5 μm) that had been thermally deoxidized at 1,500° C. in a vacuum and at 2,000° C. in a nitrogen gas stream. The metal solvent used was a Ni—Mo alloy block having a composition ratio of 1:1 by weight (Step S110 in FIG. 1). The raw material and solvent were charged up in a vessel made of sintered hBN at a weight ratio of 1:10 (Step S110 in FIG. 1), and a sapphire substrate was located on the solvent (Step S120 in FIG. 1). Solvent preparation and sample charging were all implemented in the atmosphere.

Using a resistance heating furnace to melt the metal solvent (Step S130 in FIG. 1), after which the melt was slowly cooled for synthesis of a crystal body (Step S140 in FIG. 1). Synthesis conditions involved heating the raw material and solvent up to 1,400° C. at a heating rate of 250° C./hour, holding the melt for 12 hours, cooling the melt down to 1,100° C. at 4° C./hour, and letting the melt cool down to room temperature.

Chemical treatment (hydrochloric acid/nitric acid mixture) was applied for metal solvent removal thereby collecting samples. The crystal body on the sapphire substrate was observed under an optical microscope (FIG. 5), and estimated for its optical characteristics through cathode luminescence observation (FIG. 6).

Figure 5:
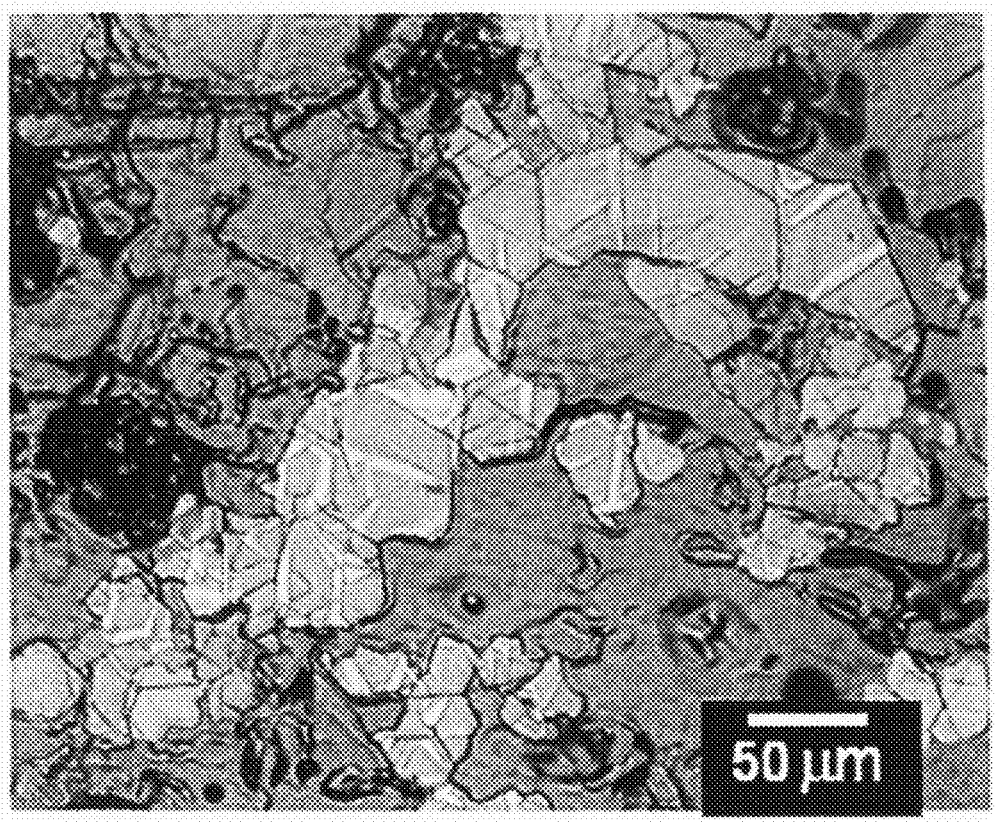
FIG. 5 is illustrative of the results of optical microscopy in Example 2.

FIG. 5 is indicative of the results of optical microscopy in Example 2.

As can clearly be seen from FIG. 5, colorless, transparent crystals were obtained on the sapphire substrate.

Figure 6:
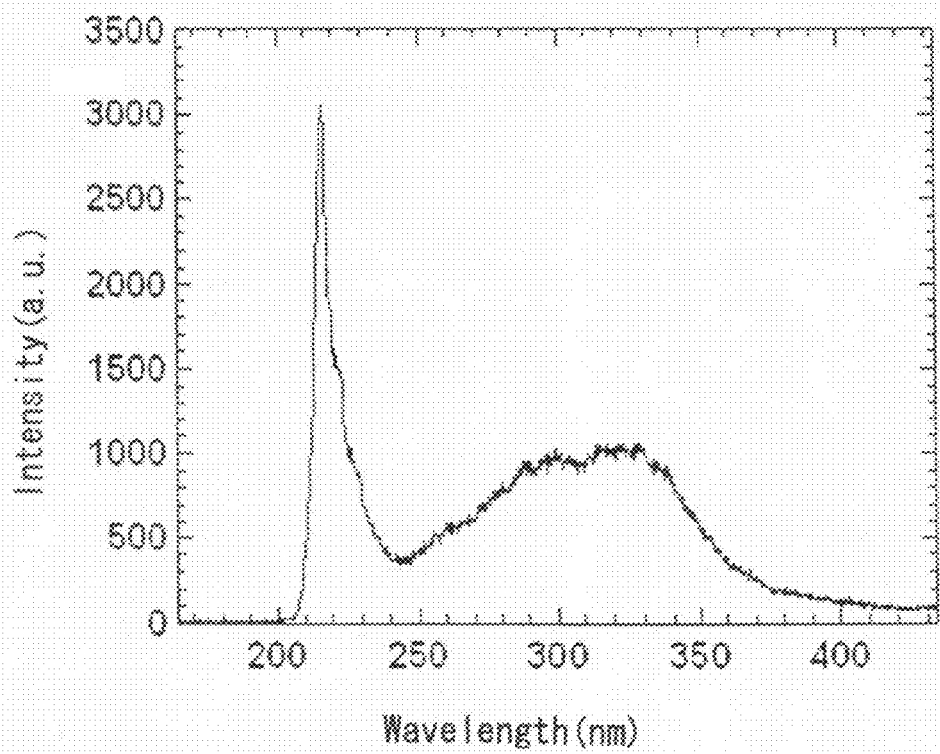
FIG. 6 is indicative of cathode luminescence spectra in Example 2.

FIG. 6 is indicative of cathode luminescence spectra in Example 2.

As can be noted from FIG. 6, there is a clear emission peak in a wavelength range of 210 nm to 230 nm, and in particular, there is an ultraviolet emission observed having the highest intensity at 215 nm wavelength at room temperature. From a comparison with Example 1, it is found that when an hBN crystal body is produced on the sapphire substrate, the use of Mo as the solvent could yield an hBN crystal body of higher purity.

Example 3

The raw material used was hexagonal boron nitride (having a grain size of about 0.5 μm) that had been thermally deoxidized at 1,500° C. in a vacuum and at 2,000° C. in a nitrogen gas stream. The metal solvent used was a Ni—Cr alloy block having a Ni weight ratio of 47%. The raw material and solvent were charged up in a vessel made of sintered hBN at a weight ratio of 1:10 (Step S210 in FIG. 2). Solvent preparation and sample charging were all implemented in the atmosphere.

Using a resistance heating furnace to melt the metal solvent (Step S220 in FIG. 2), after which the melt was slowly cooled for synthesis of a crystal body (Step S230 in FIG. 2). Synthesis conditions involved heating the raw material and solvent up to 1,430° C. at a heating rate of 25×10° C./hour, holding the melt for 9 hours, cooling the melt down to 1,250° C. at 4° C./hour, and letting the melt cool down to room temperature.

Chemical treatment (hydrochloric acid/nitric acid mixture) was applied for metal solvent removal thereby collecting samples. The obtained crystal body was observed under an optical microscope (FIG. 7), and estimated for its optical characteristics through cathode luminescence observation (FIG. 8).

Figure 7:
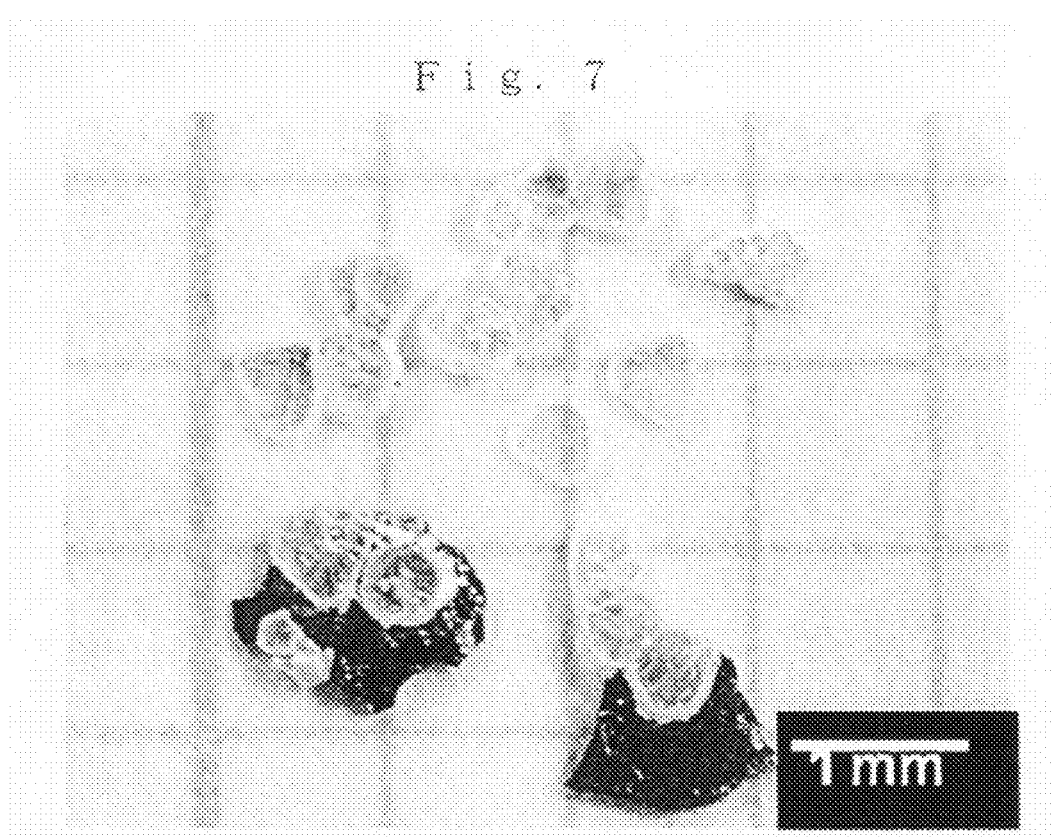
FIG. 7 is illustrative of the results of optical microscopy in Example 3.

FIG. 7 is indicative of the results of optical microscopy in Example 3.

As can clearly be seen from FIG. 7, colorless, transparent crystals were obtained. It has also been ascertained that crystal thickness is about 40 μm: easy-to-handle size.

Figure 8:
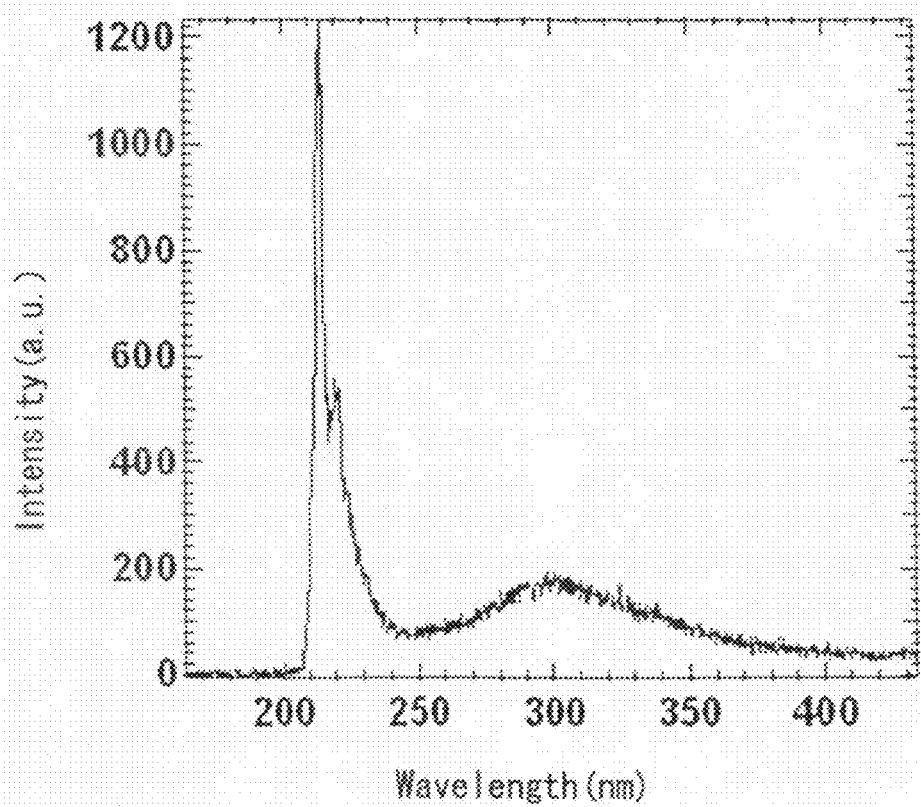
FIG. 8 is indicative of cathode luminescence spectra in Example 3.

FIG. 8 is indicative of cathode luminescence spectra in Example 3.

As can be seen from FIG. 8, there is a clear emission peak in a wavelength range of 210 nm to 230 nm, and in particular, there is an ultraviolet emission observed having the highest intensity at 215 nm wavelength at room temperature. It has thus been found that self-supported hBN crystals of high purity and easy-to-handle thickness are obtainable without recourse to any sapphire substrate.

Example 4

The raw material used was hexagonal boron nitride (having a grain size of about 0.5 μm) that had been thermally deoxidized at 1,500° C. in a vacuum and at 2,000° C. in a nitrogen gas stream. The metal solvent used was a Ni—Cr alloy block having a Ni weight ratio of 47% and a flaky Ni—Mo alloy having a composition ratio of 1:1 in a 1:1 admixture by weight. The raw material and solvent were charged up in a vessel made of sintered hBN at a weight ratio of 1:20 (Step S210 in FIG. 2). Solvent preparation and sample charging were all implemented in the atmosphere.

Using a resistance heating furnace to melt the metal solvent (Step S220 in FIG. 2), after which the melt was slowly cooled for synthesis of a crystal body (Step S230 in FIG. 2). Synthesis conditions involved heating the raw material and solvent up to 1,430° C. at a heating rate of 250° C./hour, holding the melt for 4 hours, cooling the melt down to 1,280° C. at about 4° C./hour, and letting the melt cool down to room temperature. The obtained crystals were observed under an optical microscope (FIG. 9).

Figure 9:
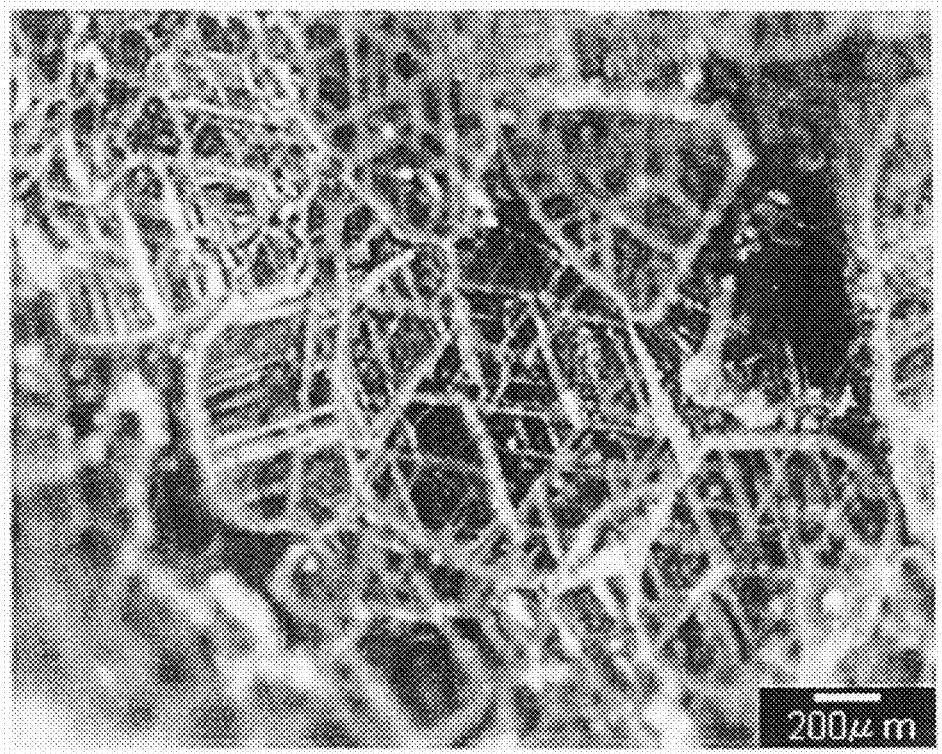
FIG. 9 is illustrative of the results of optical microscopy in Example 4.

FIG. 9 is indicative of the results of optical microscopy in Example 4.

As can clearly be seen from FIG. 9, colorless, transparent crystals were obtained. It has also been ascertained that the obtained hBN crystals are of easy-to-handle size (more than 40 μm thick). From a comparison with Example 3, it has been found that further addition of Mo as the metal solvent improves more on the solubility of boron and nitrogen, yielding good-quality hBN crystals.

Example 5

The raw material used was hexagonal boron nitride (having a grain size of about 0.5 μm) that had been thermally deoxidized at 1,500° C. in a vacuum and at 2,000° C. in a nitrogen gas stream. The metal solvent used was a Co—Cr alloy lump having a Co weight ratio of 59% and a flaky Ni—Mo alloy having a composition ratio of 1:1 in a 2:1 admixture by weight. The raw material and solvent were charged up in a vessel made of sintered hBN at a weight ratio of 1:20 (Step S210 in FIG. 2). Solvent preparation and sample charging were all implemented in the atmosphere.

Using a resistance heating furnace to melt the metal solvent (Step S220 in FIG. 2), after which the melt was slowly cooled for synthesis of a crystal body (Step S230 in FIG. 2). Synthesis conditions involved heating the raw material and solvent up to 1,450° C. at a heating rate of 250° C./hour, holding the melt for 4 hours, cooling the melt down to 1,280° C. at about 5° C./hour, and letting the melt cool down to room temperature. The obtained crystals were observed under an optical microscope (FIG. 10).

Figure 10:
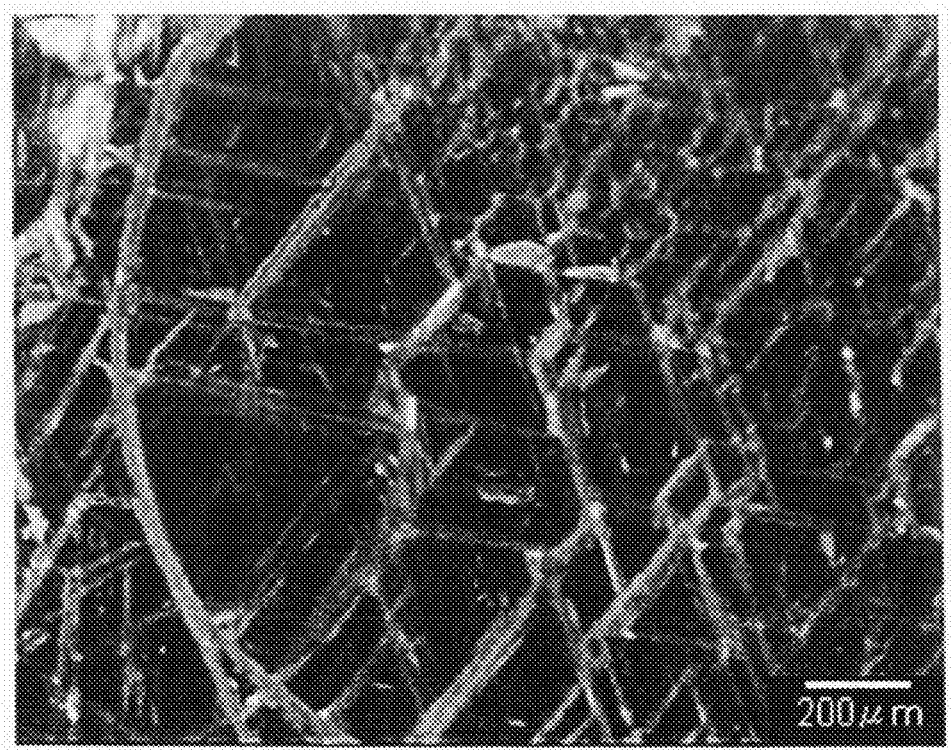
FIG. 10 is illustrative of the results of optical microscopy in Example 5.

FIG. 10 is indicative of the results of optical microscopy in Example 5.

As can clearly be seen from FIG. 10, colorless, transparent crystals were obtained. It has also been ascertained that the obtained hBN crystals are of easy-to-handle size (more than 40 μm thick).

Example 6

The raw material used was hexagonal boron nitride (having a grain size of about 0.5 μm) that had been thermally deoxidized at 1,500° C. in a vacuum and at 2,000° C. in a nitrogen gas stream. The metal solvent used was a particulate Ni—Co—Fe alloy having a composition ratio of 31:1:64 by weight and a Co—Cr alloy lump having a Co weight ratio of 59% in a 6:7 admixture by weight The raw material and solvent were charged up in a vessel made of sintered hBN at a weight ratio of 1:20 (Step S210 in FIG. 2). Solvent preparation and sample charging were all implemented in the atmosphere.

Using a resistance heating furnace to melt the metal solvent (Step S220 in FIG. 2), after which the melt was slowly cooled for synthesis of a crystal body (Step S230 in FIG. 2). Synthesis conditions involved heating the raw material and solvent up to 1,400° C. at a heating rate of 250° C./hour, holding the melt for 4 hours, cooling the melt down to 1,280° C. at about 4° C./hour, and letting the melt cool down to room temperature. The obtained crystal body was observed under an optical microscope (FIG. 11), and estimated for its optical characteristics through cathode luminescence observation (FIG. 12).

Figure 11:
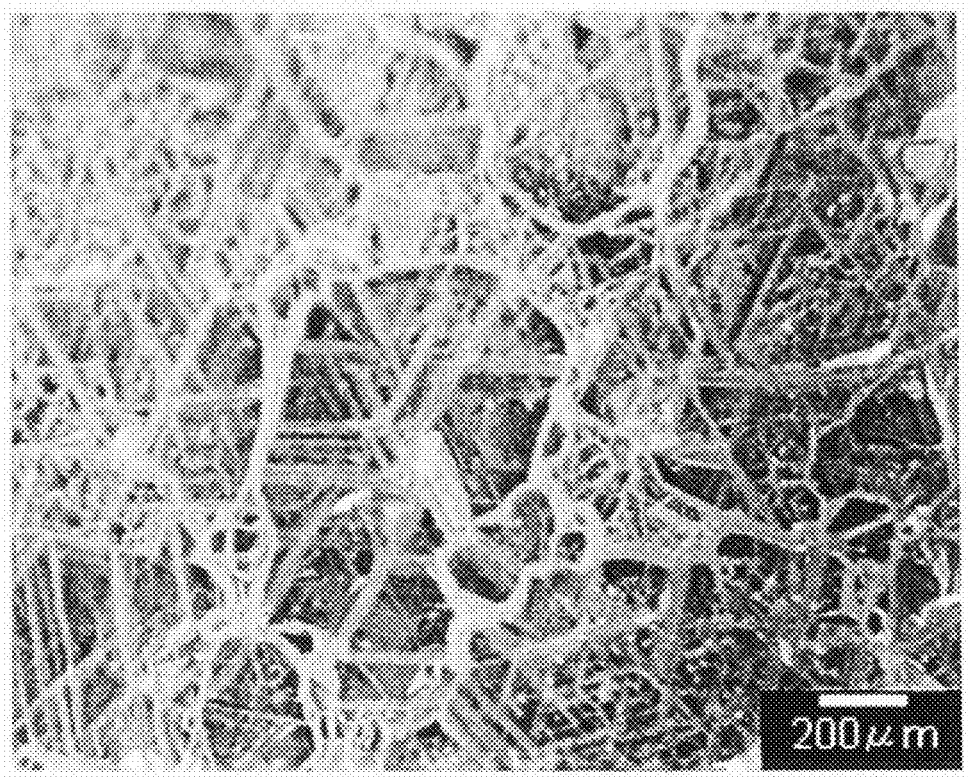
FIG. 11 is illustrative of the results of optical microscopy in Example 6.

FIG. 11 is indicative of the results of optical microscopy in Example 6.

As can clearly be seen from FIG. 11, colorless, transparent crystals were obtained. It has also been ascertained that the obtained hBN crystals are of easy-to-handle size (more than 40 μm thick).

Figure 12:
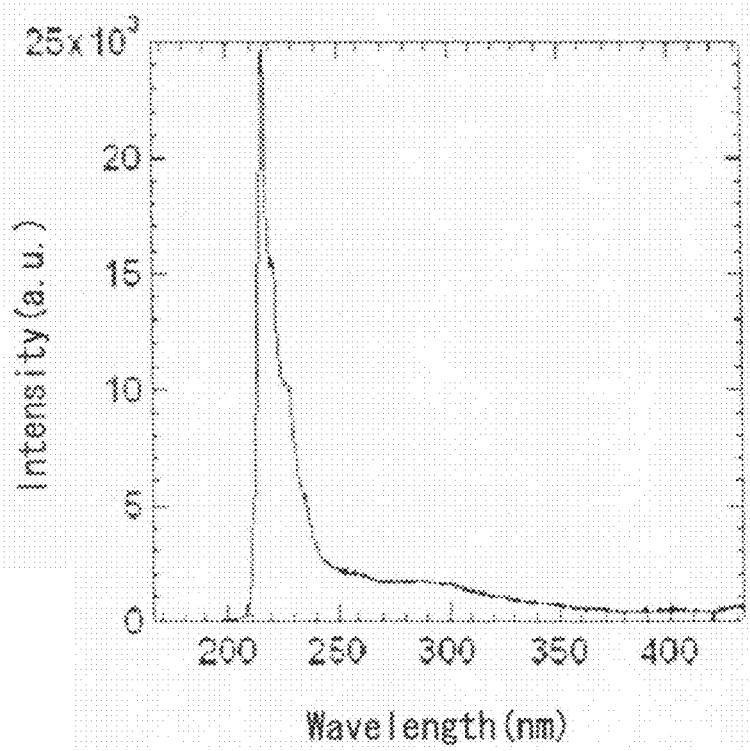
FIG. 12 is indicative of cathode luminescence spectra in Example 6.

FIG. 12 is indicative of cathode luminescence spectra in Example 6.

As can be seen from FIG. 12, there is a clear emission peak in a wavelength range of 210 nm to 230 nm, and in particular, there is an ultraviolet emission observed having the highest intensity at 215 nm wavelength at room temperature. It has thus been found that self-supported hBN crystals of high purity and easy-to-handle thickness are obtainable without recourse to any sapphire substrate.

Example 7

The raw material used was hexagonal boron nitride (having a grain size of about 0.5 μm) that had been thermally deoxidized at 1,500° C. in a vacuum and at 2,000° C. in a nitrogen gas stream. The metal solvent used was a Ni—Mo alloy block with 2% by weight of TiN powders added to it. The raw material and solvent were charged up in a vessel made of sintered hBN at a weight ratio of 1:20 (Step S210 in FIG. 2). Solvent preparation and sample charging were all implemented in the atmosphere.

Using a resistance heating furnace to melt the metal solvent (Step S220 in FIG. 2), after which the melt was slowly cooled for synthesis of a crystal body (Step S230 in FIG. 2). Synthesis conditions involved heating the raw material and solvent up to 1,530° C. at a heating rate of 250° C./hour, holding the melt for 12 hours, cooling the melt down to 1,250° C. at about 4° C./hour, and letting the melt cool down to room temperature.

Figure 13:
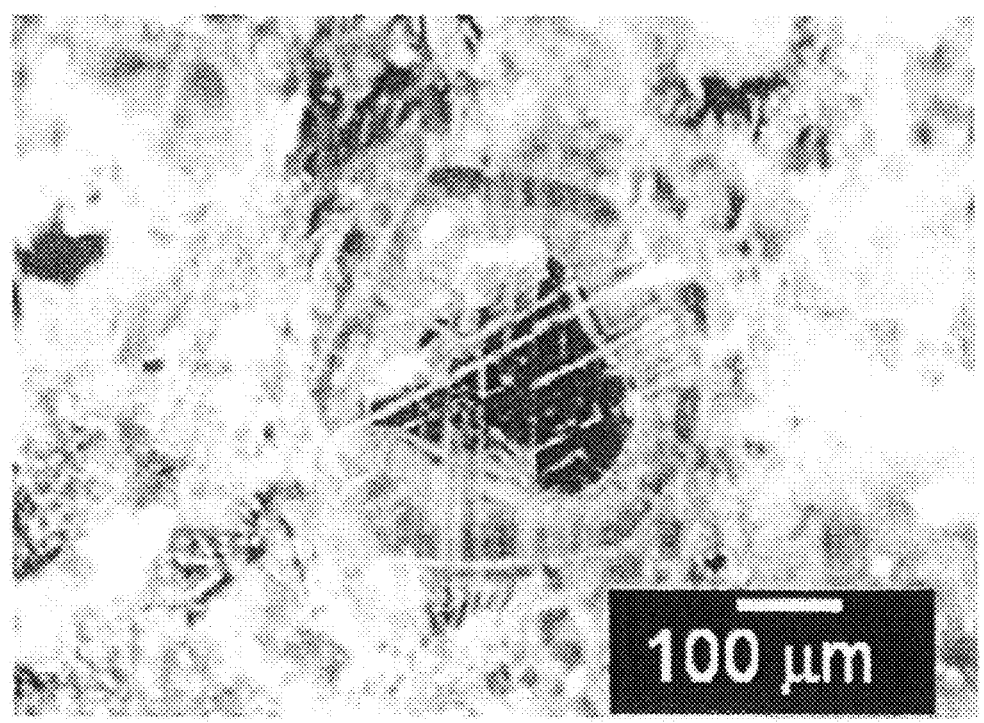
FIG. 13 is illustrative of the results of optical microscopy in Example 7.
Figure 14:
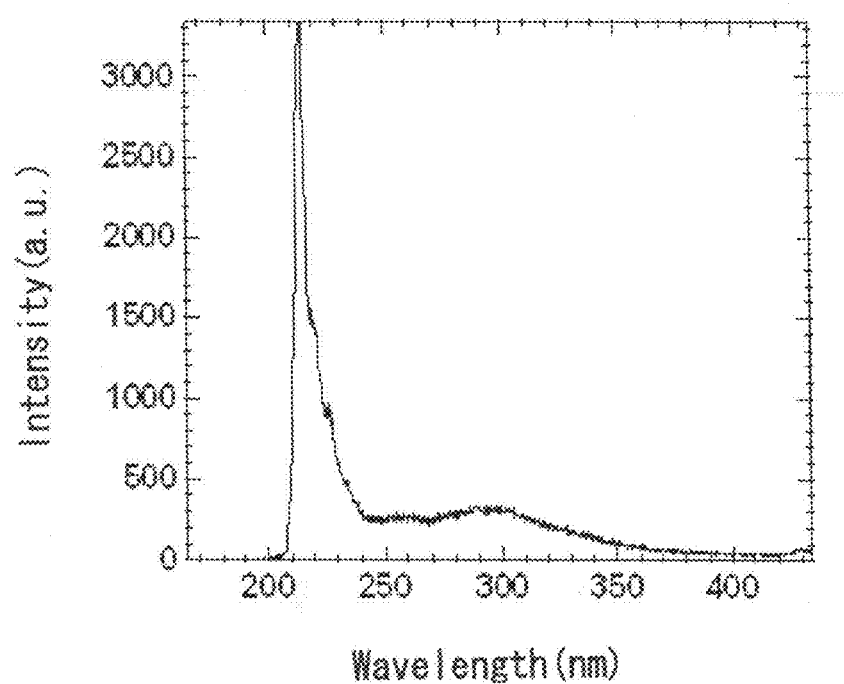
FIG. 14 is indicative of cathode luminescence spectra in Example 7.

The obtained crystals were observed under an optical microscope (FIG. 13), and estimated for its optical characteristics through cathode luminescence observation (FIG. 14).

FIG. 13 is indicative of the results of optical microscopy in Example 7.

As can clearly be seen from FIG. 13, colorless, transparent crystals were obtained. It has also been ascertained that the obtained hBN crystals are of easy-to-handle size (more than 40 μm thick).

FIG. 14 is indicative of cathode luminescence spectra in Example 7.

As can be seen from FIG. 14, there is a clear emission peak in a wavelength range of 210 nm to 230 nm, and in particular, there is an ultraviolet emission observed having the highest intensity at 215 nm wavelength at room temperature. From Example 7, it has been found that even when TiN is used in place of Cr, self-supported hBN crystals of high purity and easy-to-handle thickness are obtainable without recourse to any sapphire substrate.

Example 8

The raw material used was hexagonal boron nitride (having a grain size of about 0.5 μm) that had been thermally deoxidized at 1,500° C. in a vacuum and at 2,000° C. in a nitrogen gas stream. The metal solvent used was a flaky Ni—V alloy having a Ni weight ratio of 53%. The raw material and solvent were charged up in a vessel made of sintered hBN at a weight ratio of 1:10 (Step S210 in FIG. 2). Solvent preparation and sample charging were all implemented in the atmosphere.

Using a resistance heating furnace to melt the metal solvent (Step S230 in FIG. 2), after which the melt was slowly cooled for synthesis of a crystal body (Step S230 in FIG. 2). Synthesis conditions involved heating the raw material and solvent up to 1,400° C. at a heating rate of 250° C./hour, holding the melt for 6 hours, cooling the melt down to 1,240° C. at about 4° C./hour, and letting the melt cool down to room temperature. The obtained crystals were observed under an optical microscope (FIG. 15).

Figure 15:
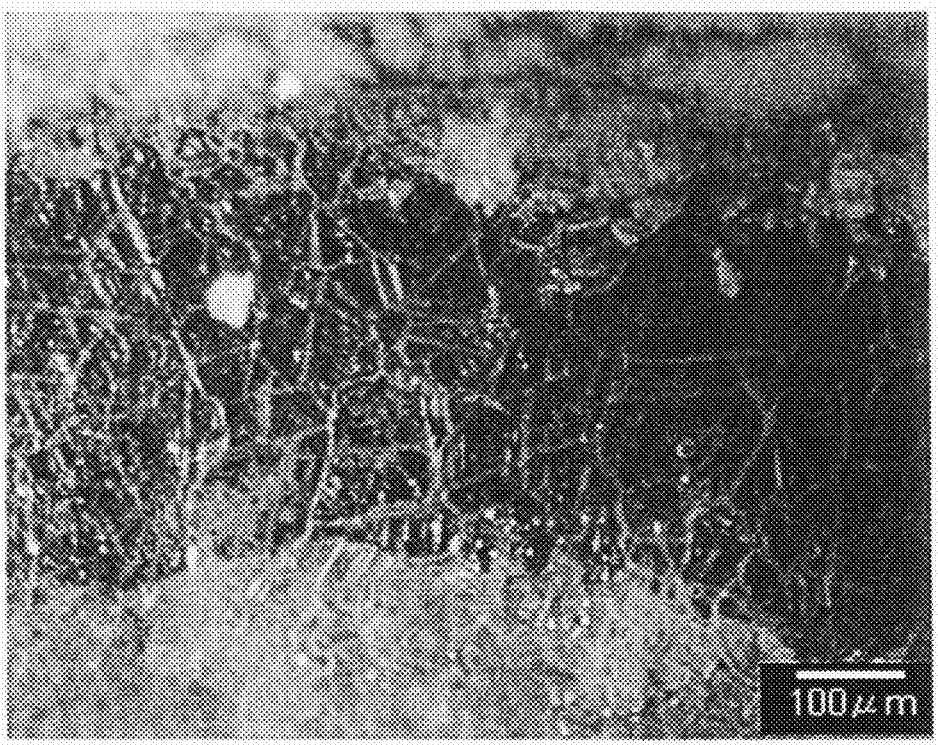
FIG. 15 is illustrative of the results of optical microscopy in Example 8.

FIG. 15 is indicative of the results of optical microscopy in Example 8.

As can clearly be seen from FIG. 15, colorless, transparent crystals were obtained. It has also been ascertained that the obtained hBN crystals are of easy-to-handle size (more than 40 μm thick).

Example 9

The raw material used was hexagonal boron nitride (having a grain size of about 0.5 μm) that had been thermally deoxidized at 1,500° C. in a vacuum and at 2,000° C. in a nitrogen gas stream. The metal solvent used was a flaky Ni—V alloy having a Ni weight ratio of 53% and a flaky Co—Mo alloy having a Co weight ratio of 60% in a 1:1 admixture by weight. The raw material and solvent were charged up in a vessel made of sintered hBN at a weight ratio of 1:10 (Step S210 in FIG. 2). Solvent preparation and sample charging were all implemented in the atmosphere.

Using a resistance heating furnace to melt the metal solvent (Step S220 in FIG. 2), after which the melt was slowly cooled for synthesis of a crystal body (Step S230 in FIG. 2). Synthesis conditions involved heating the raw material and solvent up to 1,400° C. at a heating rate of 250° C./hour, holding the melt for 6 hours, cooling the melt down to 1,240° C. at about 4° C./hour, and letting the melt cool down to room temperature. The obtained crystals were observed under an optical microscope (FIG. 16).

Figure 16:
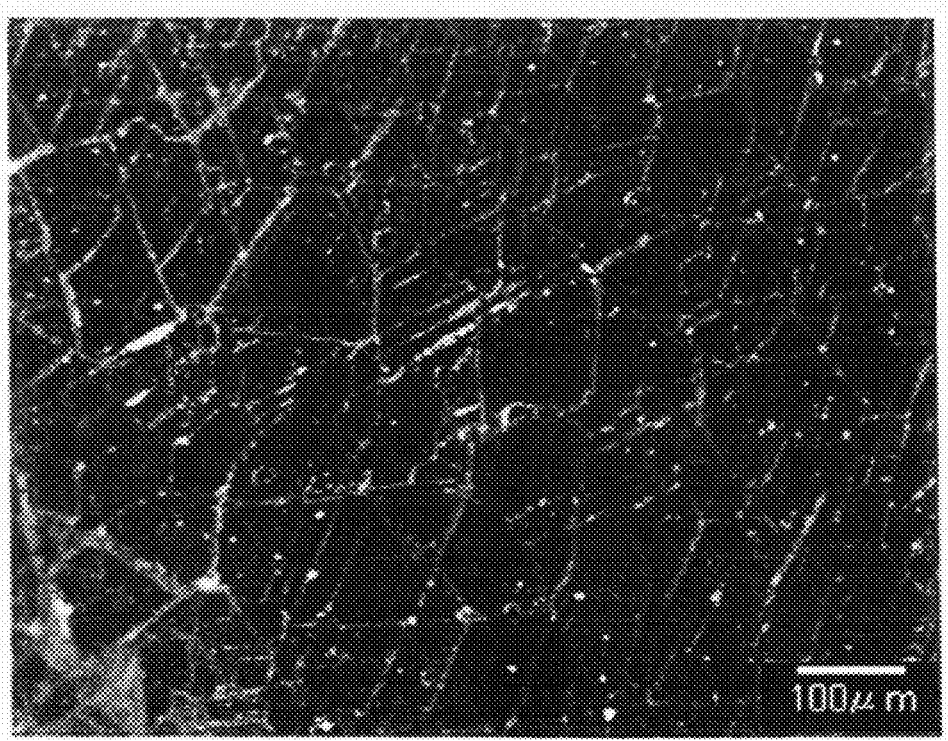
FIG. 16 is illustrative of the results of optical microscopy in Example 9.

FIG. 16 is indicative of the results of optical microscopy in Example 9.

As can clearly be seen from FIG. 16, colorless, transparent crystals were obtained. It has also been ascertained that the obtained hBN crystals are of easy-to-handle size (more than 40 μm thick).

From Examples 8 and 9, it has been found that even when V is used in place of Cr and TiN, self-supported hBN crystals of high purity and easy-to-handle thickness are obtainable without recourse to any sapphire substrate.

Comparative Example 1

Example 3 was repeated except that a sapphire substrate was located on the metal solvent. In this case, the sapphire substrate reacted with Cr, resulting in none of recrystallization of hBN crystals. It has been found that the addition of Cr to the solvent is an obstructing factor for crystal growth onto the sapphire substrate.

APPLICABILITY TO THE INDUSTRY

The hBN crystals obtained by the present invention are applied to deep ultraviolet light emitting materials and any desired devices using them. More specifically, deep ultraviolet emitting materials comprising the inventive hBN crystal body could be used in opto-electronics for super-high density optical recording making use of short wavelength ultraviolet light's convergence capability, medical fields such as superfine light laser scalpels, and environmental chemistry such as the breakdown of dioxin as well.

What we claim is:

1. A process of producing a hexagonal boron nitride crystal body, characterized by comprising:
    a preparation step of preparing a mixture of a boron nitride raw material and a metal solvent comprising a transition metal,
    a contact step of bringing a sapphire substrate in contact with said mixture,
    a heating step of heating said mixture, and a recrystallization step of recrystallizing at normal pressure a melt obtained in said heating step.

2. The process according to claim 1, characterized in that said hexagonal boron nitride crystal body emits out ultraviolet radiation in a wavelength range of 210 to 230 nm.

3. The process according to claim 1, characterized in that said metal solvent is selected from the group of consisting of Fe, Ni, Co, and a combination thereof.

4. A process of producing a hexagonal boron nitride crystal body, characterized by comprising:
   a preparation step of preparing a mixture of a boron nitride raw material and a metal solvent comprising a transition metal, wherein said metal solvent includes a transition metal selected from the group consisting of Fe, Ni, Co, and a combination thereof, and at least one substance selected from the group consisting of Cr, TiN and V,
   a heating step of heating said mixture, and
   a recrystallization step of recrystallizing at normal pressure a melt obtained in said heating step.

5. The process according to claim 4, characterized in that said hexagonal boron nitride crystal body emits out ultraviolet radiation in a wavelength range of 210 to 230 nm.

6. The process according to claim 3, characterized in that said metal solvent further includes Mo.

7. The process according to claim 1, characterized in that said boron nitride raw material is hexagonal boron nitride.

8. The process according to claim 1, characterized in that before said preparation step, there is a step provided of deoxidizing said boron nitride raw material.

9. The process according to claim 1, characterized in that in said heating step said mixture is heated up to a temperature higher than an eutectic point of said boron nitride raw material and said metal solvent.

10. The process according to claim 1, characterized in that said heating step, and said recrystallization step is implemented in an inert atmosphere.

11. The process according to claim 1, characterized in that in said recrystallization step said melt is either cooled or provided with a temperature gradient.

12. The process according to claim 1, characterized in that after said recrystallization step, there is a step provided of removing said metal solvent using a solution containing hydrochloric acid and nitric acid.

* * * * *